Sept. 17, 1957 J. F. SPADES ET AL 2,806,964

TRANSISTOR REGENERATIVE PULSE AMPLIFIER FOR POWER APPLICATIONS

Filed April 18, 1955

INVENTORS
JOSEPH FRANCIS SPADES
A. WILLIAM CARLSON
BY Donald C Kegvaney and
Wade Koontz
ATTORNEYS 2,806,964

TRANSISTOR REGENERATIVE PULSE AMPLIFIER FOR POWER APPLICATIONS

Joseph Francis Spades, Cochituate, Mass., and Arthur William Carlson, Harrison, Maine, assignors to the United States of America as represented by the Secretary of the Air Force Application April 18, 1955, Serial No. 502,258

7 Claims. (Cl. 307—88.5)

(Granted under Title 35, U. S. Code (1952), sec. 266)

The invention described herein may be manufactured and used by or for the United States Government for governmental purposes without payment to me of any royalty thereon.

This invention relates to a pulse power amplifier or output stage of general application to transistor pulse circuitry. More particularly it relates to such a power amplifier having a plurality of transistors effectively connected in parallel which has been found to result not only in increased power handling capacity but also in decreased output impedance and increased regeneration which in turn makes it possible to achieve faster pulse rise times than can be achieved in the conventional cascaded connection.

The invention is intended for use in transistorized digital circuits or wherever it is required to develop a voltage across a low impedance. The circuit is unique not only in developing more pulse power at a lower impedance level than was previously attainable, but also in the manner in which switching action is obtained.

It is an object of this invention, therefore, to provide a plural stage transistor parallel regenerative pulse amplifier for use as an output stage in digital or pulse circuitry or wherever it is necessary to develop a voltage across a low output impedance.

It is a further object of this invention to provide such an amplifier of increased power handling capacity which has an output pulse of extremely fast rise time and which obtains its switching action in a unique manner.

These and other objects and advantages which will be apparent from a reading of the detailed specification below are achieved by providing a plurality of transistors which are preferably, but not necessarily, of the point contact type and which have common base and common collector connections but have each emitter returned through separate paths. The transistors are biased to cutoff. A trigger pulse is applied to the emitter of one stage and with a low impedance in the collector output circuit the transistor goes into saturation with a large increase in base current. An inductor in the common base circuit applies its resulting voltage to all of the transistors, hence all stages are effectively triggered. Due to the inertia effect of the inductor this action is not instantaneous but rather is described by the base voltage versus base current characteristic which is of the N shape, usual for point contact transistors and includes a negative resistance region. The resulting action is very similar in form to that of a single stage monostable switching circuit.

For a more detailed description of the invention reference is made to the drawings wherein.

Figure 1:
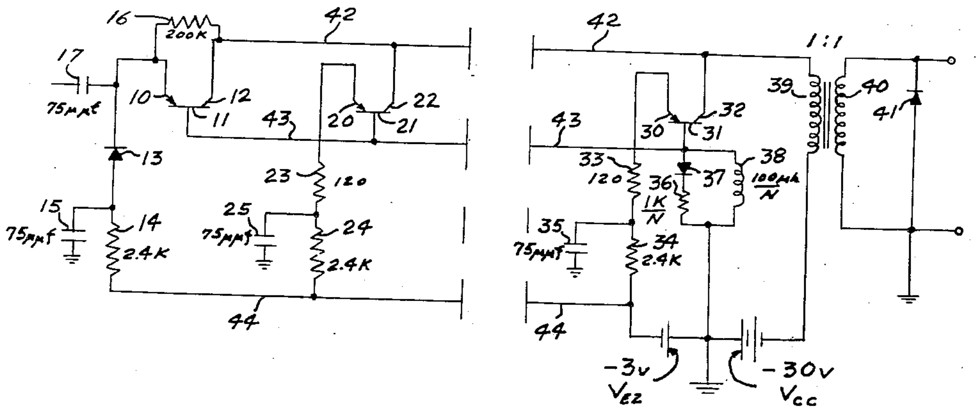
Figure 1 is a broken schematic circuit diagram of the amplifier.
Figure 2:
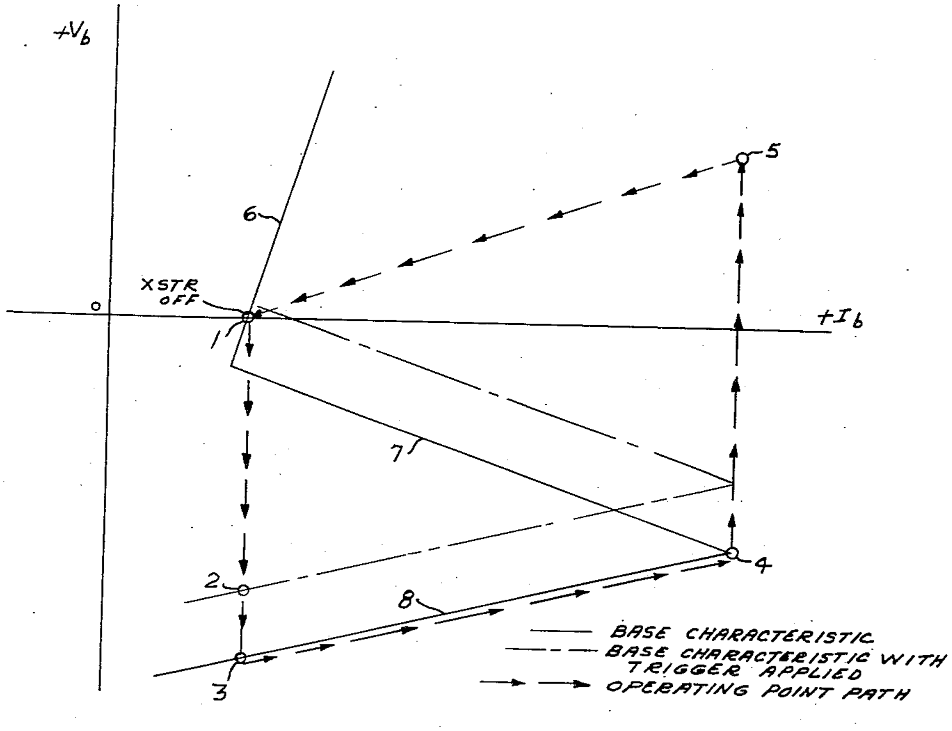
Figure 2 is a graph showing the base characteristic of the triggered stage transistor both with and without the trigger pulse applied and also showing the path of the operating point on the characteristic when the emitter is lifted out of cutoff by an applied trigger pulse.

The amplifier shown in Figure 1 illustratively comprises three identical point contact transistors, but, as indicated by the break lines, it is understood that any desired number, N, of transistors may be used. Additional stages would have connections identical to those shown for the middle or second stage in Figure 1. These transistors have a base characteristic which, as shown in Figure 2, is closely approximated by a linear cutoff region 6, a negative resistance transition or active region 7, and a linear saturation region 8. A single stable quiescent operating point 1 in the cutoff region results from the circuit constants shown in Figure 1 which are intended to be representative of those used with N stages of point contact type transistors.

The three such transistors of Figure 1 are shown as having emitters 10, 20, and 30, bases 11, 21, and 31, and collectors 12, 22, and 32. Each of the collectors is connected by a lead 42 to one terminal of the primary 39 of an output transformer having a turns ratio of 1:1. The other terminal of the primary 39 is grounded for alternating current through the —30 volt collector supply $V_{cc}$. Each base is connected by a line 43 to one terminal of an inductor 38, the other terminal of which is grounded. A resistor 36 and diode 37 are connected in series across the terminals of the inductor 38 for a purpose which will be described below.

Input signal trigger pulses are coupled to emitter 10 by coupling capacitor 17. A diode 13 and resistor 14 are connected in series with emitter 10, the resistor 14 being bypassed to ground for alternating current by capacitor 15. A bias stabilizing resistor 16 is connected between collector 12 and emitter 10. Emitters 20 and 30 have resistors 23, 24 and 33, 34 respectively connected in series therewith. Resistors 24 and 34 are bypassed to ground for alternating current by capacitors 25 and 35 respectively. Emitter resistors 14, 24, and 34 are each connected by lead 44 to the negative side of the three volt emitter bias supply $V_{ee}$ the positive side of which is grounded as is the positive side of the collector supply $V_{cc}$. Output is taken from the secondary 40 of the output transformer which has a diode 41 connected across its terminals to clamp the base of the pulse output to zero.

Considering first the no signal direct current conditions of the circuit, it will be noted that the triggered stage emitter 10 has the back biased diode 13 in series with the emitter-base diode of the transistor. In the absence of stabilizing resistor 16, the emitter voltage would be determined by the value of the back resistance of both of these diodes and by the value of $V_{ee}$ as may be seen by a simple application of Kirchhoff's law to the loop including $V_{ee}$, coil 38, the diodes and resistor 14. The resistances of both the external and the transistor diode vary to a large degree. In order to provide a constant bias for emitter 10, a 200K resistor 16 is connected between collector 12 and emitter 10. Since resistor 16 is connected to the negative side of $V_{cc}$ through the primary 39 of the output transformer, it provides a forward bias to the diode 13 causing it to conduct through its low forward resistance and thereby clamping the emitter 10 at substantially the bias supply voltage $V_{ee}$. This fixed negative emitter bias leads to a quiescent operating point located as shown at 1 in Figure 2 in the cutoff region 6 of the $V_b$—$I_b$ characteristic of the transistor.

In operation, when a short positive trigger pulse is applied to negatively biased emitter 10 it effectively changes the base characteristic to that shown by the dashed line in Figure 2, i. e., the emitter is lifted out of cutoff into an unstable region and the transistor goes into conduction. With a low impedance in the collector circuit, the transistor ultimately goes into saturation with a large increase in base current as shown between points 3 and 4. This increase in base current cannot take place instantaneously, however, because of the coil 38, but is rather described by the base characteristic. Therefore, when the short trigger pulse is applied the base voltage must first increase in magnitude until point 2 is reached on the effective base characteristic with the trigger applied. When the trigger pulse is removed (assuming a short trigger pulse which is removed when the transistor fires) the operating point drops to point 3 in the saturation region 8 of the base characteristic. In view of the constants of the external circuit this is not a stable operating point and the base voltage decays along the base characteristic to point 4 with the above noted increase in base current. At point 4 which is also not a stable point the base voltage quickly reverses direction in an attempt to snap back along a constant current line to the cutoff portion 6 of the base characteristic extended. When the base voltage becomes positive diode 37 (which is in parallel with coil 38 through which base current has built up) begins to conduct thereby limiting the positive pulse and returning the operating point to its original cutoff condition along the line 5—1.

Once the trigger turns the transistor on, it loses control and the transistor is from then on circuit controlled. Since there is but one common base circuit, the voltage developed across the coil 38 by the triggered stage is also impressed across base to ground of all the remaining stages. Thus, by triggering one emitter, the entire chain of transistors is controlled by means of a common base connection. The emitter network limits the current to prevent transistor burnout. Burnout would occur if the collector circuit time constant were less than the time that the transistor is in saturation since this would result in the full $V_{cc}$ collector supply being applied to the saturated circuit.

Due to the common collector and common base connections the transistors are effectively in parallel as seen looking to the left from the primary 39 of the output transformer. Hence the output impedance as seen from 39 is substantially less than the output impedance of a single transistor stage and each transistor carries in its collector circuit only a fraction of the total output current flowing in the primary 39 of the output transformer. The effectively parallel connection has also been found to increase regeneration and hence lead to a substantially faster pulse rise time than is attainable with single or cascaded stages.

While a preferred embodiment of the invention has been illustrated and described in detail many variations of the teaching thereof will be obvious to those skilled in the art. It is understood that the preferred embodiment is given by way of illustration only and that the teaching of the invention is defined solely by the appended claims.

What we claim is:

1. A plural stage transistor parallel regenerative pulse amplifier comprising, a plurality of transistors, the collector of each transistor having a common direct connection to an output terminal, a direct current power supply and the primary of a low impedance output transformer connected in series between ground and said output terminal, the base of each transistor having a common connection to one terminal of an inductor the other terminal of which is connected to ground, a diode and a series resistor connected in shunt across the terminals of said inductor, the polarity of said diode being such that its forward conduction direction is from said common base connection of said inductor to ground, the emitter of each transistor having a first and a second resistance in series therewith, an alternating current bypass condenser connected from the junction of said first and second resistance in each emitter circuit to ground, the other end of each of said second resistances having a common connection to one side of an emitter bias supply the other side of which is connected to ground, means to apply a trigger pulse to one of said transistor stages, said first resistance in series with the emitter of said triggered stage being the back resistance of a back biased diode, and a third resistance directly connected between the collector and emitter of said triggered stage whereby the emitter bias of said triggered stage is clamped to the value of the bias supply.

2. A plural stage transistor parallel regenerative pulse amplifier comprising, a plurality of transistors, the collector of each transistor having a common direct connection to an output terminal, the base of each transistor having a common connection to one terminal of an inductor the other terminal of which is connected to ground, a direct current power supply and a low impedance output circuit connected between said output terminal and ground, each emitter having a separate alternating current connection to ground through a first resistance and a blocking condenser, each emitter further having a direct current connection to one terminal of an emitter bias supply the other terminal of which is connected to ground, and means to apply a trigger pulse to the emitter of one of said transistors.

3. Apparatus as in claim 2 wherein said low impedance output circuit includes an output transformer.

4. Apparatus as in claim 2 wherein a diode and a series resistor are connected in shunt across the terminals of said inductor, the polarity of said diode being such that its forward conduction direction is from the common base connection of said inductor to ground.

5. Apparatus as in claim 2 wherein said emitter bias supply is of such a value as to bias each transistor to cutoff.

6. Apparatus as in claim 2 wherein said direct current connection from each emitter to said bias supply is through a second resistance in each emitter circuit, said second resistance being connected between said first resistance and the ungrounded side of said bias supply.

7. Apparatus as in claim 2 wherein said first resistance in series with the emitter of the transistor to which a trigger pulse is applied is the back resistance of a back biased diode and wherein a third resistance is directly connected between the collector and emitter of said triggered stage.

References Cited in the file of this patent

UNITED STATES PATENTS

| | | |
|---|---|---|
| 2,533,001 | Eberhard | Dec. 5, 1950 |
| 2,629,833 | Trent | Feb. 24, 1953 |
| 2,703,368 | Wrathall | Mar. 1, 1955 |